(12) United States Patent
Maxwell

(10) Patent No.: US 10,773,811 B2
(45) Date of Patent: Sep. 15, 2020

(54) WINDOW HEATING CONTROL SYSTEM AND METHODS OF OPERATING THE SAME

(71) Applicant: THE BOEING COMPANY, Chicago, IL (US)

(72) Inventor: Scott D. Maxwell, Renton, WA (US)

(73) Assignee: THE BOEING COMPANY, Chicago, IL (US)

( * ) Notice: Subject to any disclaimer, the term of this patent is extended or adjusted under 35 U.S.C. 154(b) by 288 days.

(21) Appl. No.: 15/833,254

(22) Filed: Dec. 6, 2017

(65) Prior Publication Data
US 2019/0168881 A1 Jun. 6, 2019

(51) Int. Cl.
| B64D 15/22 | (2006.01) |
| H05B 1/02 | (2006.01) |
| H05B 3/84 | (2006.01) |
| G01K 7/16 | (2006.01) |
| B64D 15/12 | (2006.01) |
| B60L 1/08 | (2006.01) |
| B64C 1/14 | (2006.01) |
| G01R 27/02 | (2006.01) |

(52) U.S. Cl.
CPC ............... B64D 15/22 (2013.01); B60L 1/08 (2013.01); B64C 1/1476 (2013.01); B64D 15/12 (2013.01); G01K 7/16 (2013.01); H05B 1/0236 (2013.01); H05B 3/84 (2013.01); *B64C 1/1484* (2013.01); *G01R 27/02* (2013.01); *H05B 2203/035* (2013.01); *H05B 2214/02* (2013.01)

(58) Field of Classification Search
CPC .......... B64D 15/22; B64D 15/12; B60L 1/08; B64C 1/1476; G01K 7/16

USPC ......................................... 219/203
See application file for complete search history.

(56) References Cited

U.S. PATENT DOCUMENTS 5,072,098 A * 12/1991 Matthews ............. H02J 7/1438
219/203
9,578,686 B2    2/2017  Apdalhaliem et al.
2004/0232117 A1  11/2004  Gerhardinger
2013/0075531 A1  3/2013  Jiao
(Continued)

FOREIGN PATENT DOCUMENTS

DE        10058434       6/2002
DE       102007020815   11/2008
(Continued)

OTHER PUBLICATIONS

Extended European Search Report regarding European Patent Application Serial No. 18210233.5 dated May 17, 2019, pp. 1-8.
(Continued)

*Primary Examiner* — Vishal Pancholi
(74) *Attorney, Agent, or Firm* — Armstrong Teasdale LLP

(57) ABSTRACT

A window heating system for providing current to a heating element includes a first sensor, a second sensor, and a sensor selection module configured to determine a state of the first and the second sensors. The sensor selection module includes a first comparator associated with the first sensor and configured to determine whether a condition of the first sensor is satisfied. The window heating system also includes a controller configured to control current to the heating element based on the second sensor when the first comparator determines the condition of the first sensor is not satisfied.

23 Claims, 5 Drawing Sheets

(56) References Cited

U.S. PATENT DOCUMENTS

2015/0171623 A1* 6/2015 Jiao .................. B64C 1/1476
361/49
2015/0171624 A1   6/2015 Duarte et al.

FOREIGN PATENT DOCUMENTS

EP      3034388 A1   6/2016
WO   2016027184 A1   2/2016

OTHER PUBLICATIONS

European Office Action regarding European Patent Application No. 18 210 233.5 dated Mar. 27, 2020; pp. 1-6.

* cited by examiner

WINDOW HEATING CONTROL SYSTEM AND METHODS OF OPERATING THE SAME

BACKGROUND

The field of the disclosure relates to commercial aircraft. More specifically, the disclosed embodiments relate to systems and methods for controlling the heating of a window in an aircraft.

At least some known commercial aircraft include a window heating system to provide heat to the windows, especially in the cockpit, to prevent the formation of ice on the window. Some such heating systems include two temperature sensors, a primary and a secondary, that measure the temperature as a change in resistance across the sensor. In at least some known window heating systems, when a user desires to switch temperature sensors because they suspect an error in the primary sensor, the user powers down the heating system and then powers it back up to switch between sensors. Such a system restart may be time consuming and cause ice to form on the window.

Additionally, in at least some known window heating systems, moisture may enter the window and cause a partial short circuit in one of the temperature sensors. A partial short circuit results in a reduced resistance across the sensor, which signals a false temperature reduction to the heating system and may cause at least some known heating systems to provide additional power to the heating element to increase the temperature of the window. However, in cases where the reduction in resistance is caused by a partial short circuit, and not a reduction in temperature, the additional heat provided by the heating element may result in a shortened service lifetime of the window.

Furthermore, in at least some known window heating systems, when a fault in one of the temperature sensors is detected, the heating system shuts down and terminates current flow to the heating element. Such a shut-down requires a manual interrogation of the heating system to determine the fault. The interrogation may result in a system restart to switch to another temperature sensor, or it may result in replacement of the window and window heating control system. Such manual interrogations are time consuming and may increase maintenance and labor costs associated with the aircraft.

BRIEF DESCRIPTION

In one aspect, a window heating system for providing current to a heating element is provided. The window heating system includes a first sensor, a second sensor, and a sensor selection module configured to determine a state of the first and the second sensors. The sensor selection module includes a first comparator associated with the first sensor and configured to determine whether a condition of the first sensor is satisfied. The window heating system also includes a controller configured to control current to the heating element based on the second sensor when the first comparator determines the condition of the first sensor is not satisfied.

In yet another aspect, an aircraft window heating system is provided. The aircraft window heating system includes a first sensor disposed proximate an aircraft window that includes a resistance that varies with changes in the temperature of the window. The aircraft window heating system also includes a first pair of current sensors respectively disposed between a first pair of power source connections and the first sensor such that the first pair of current sensors are in series with the first sensor. A first comparator provides a match output where a difference between the first pair of current sensors is within a predetermined amount. The aircraft window heating system further includes a second sensor disposed proximate the aircraft window and includes a resistance that varies with changes in the temperature of the window. A second pair of current sensors is respectively disposed between a second pair of power source connections and the second sensor such that the second pair of current sensors is in series with the second sensor. A second comparator provides a match output where the difference between the current levels sensed by the second pair of current sensors is within a predetermined amount. The aircraft window heating system further includes a controller in communication with the first comparator and second comparator for controlling a heating element disposed on the aircraft window. The controller is configured to control the current level to the heating element based on the first sensor where the first comparator provides a match output, and to control the current level to the heating element based on the second sensor where the first comparator does not provide a match output and the second comparator provides a match output, and to provide a nominal current to the heating element where the first comparator and second comparator both do not provide a match output.

In still another aspect, a method of controlling current to a heating element in a window heating system is provided. The method includes measuring a resistance value of the window with a first sensor and measuring a resistance value of the window with a second sensor. The method also includes determining a state of the first sensor using a first comparator associated with the first sensor to determine whether a condition of the first sensor is satisfied and determining a state of the second sensor using a second comparator associated with the second sensor to determine whether a condition of the second sensor is satisfied. Current flow to the heating element is then controlled based on the resistance value of the first sensor when the first comparator determines the condition of the first sensor is satisfied. The method also includes controlling current flow to the heating element based on the resistance value of the second sensor when the first comparator determines the condition of the first sensor is not satisfied and when the second comparator determines the condition of the second sensor is satisfied. Additionally, a nominal amount of current flow is provided to the heating element when first comparator and second comparator determine that the conditions of the first sensor and the second sensor are not satisfied.

The features, functions, and advantages that have been discussed can be achieved independently in various embodiments or may be combined in yet other embodiments further details of which can be seen with reference to the following description and drawings.

DETAILED DESCRIPTION

Figure 1:
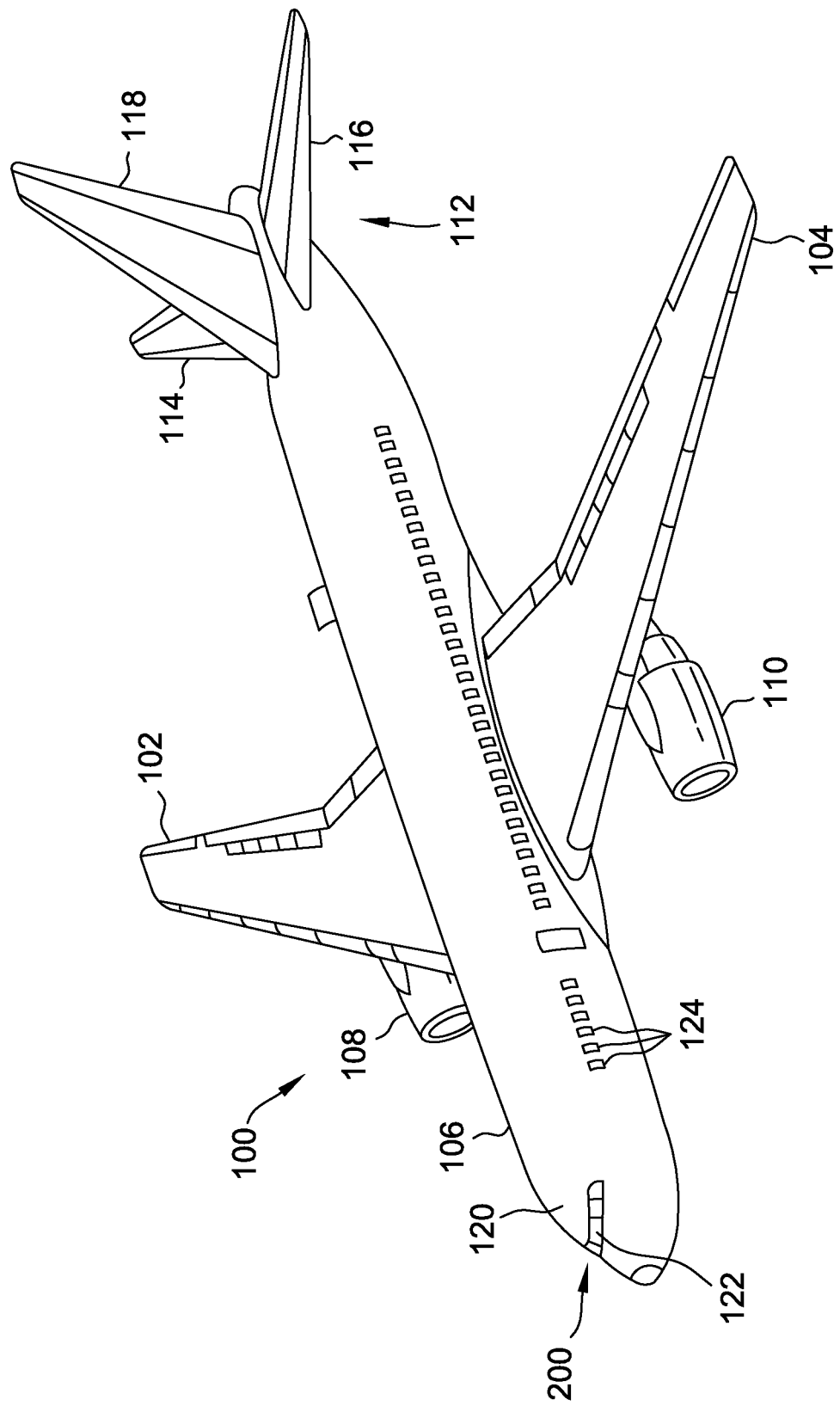
FIG. 1 is a perspective view of an aircraft.

The implementations described herein include a window heating system for use with an aircraft. The window heating system provides current to a heating element positioned proximate a cockpit window in the aircraft to maintain the temperature of the cockpit window within a predetermined ranges to prevent formation of ice crystals on the cockpit window. The aircraft window heating system includes a first sensor that measures a resistance in the window that varies with changes in temperature. The aircraft window heating system also includes a first pair of current sensors coupled in series on opposite sides of the first sensor. A first comparator provides a match output where a difference between the first pair of current sensors is within a predetermined amount. The aircraft window heating system further includes a second sensor that measures a resistance in the window that varies with changes in temperature and a second pair of current sensors coupled in series on opposite sides of the second sensor. A second comparator provides a match output where the difference between the current levels sensed by the second pair of current sensors is within a predetermined amount. The aircraft window heating system further includes a controller in communication with the first comparator and second comparator and configured to control the current level to the heating element based on the first sensor where the first comparator provides a match output, and to control the current level to the heating element based on the second sensor where the first comparator does not provide a match output and the second comparator provides a match output, and to provide a nominal current to the heating element where the first comparator and second comparator both do not provide a match output.

The window heating system described herein is able to detect a partial short circuit condition in a primary sensor and automatically switch to base operation on a signal from a secondary, backup sensor after detection of the partial short circuit in the primary sensor. Such automatic recovery prevents a time consuming system restart that may result in power not being provide to a heating element for an extended duration. Additionally, the window heating system described herein is able to detect when both the primary sensor and the secondary sensor are experiencing a partial short circuit condition and, rather than disable the system as in at least some known heating systems, automatically switch to a nominal operational mode to provide the heating element with an amount of power to maintain the window at a temperature that prevents ice formation. In such a nominal operating mode, the amount of power provided to the heating element is not based on signals from either of the sensors, and, as such, facilitates preventing ice formation on the cockpit window even when neither sensor is operational.

Described herein are computer systems such as the window heating system and related computer systems. As described herein, all such computer systems include a processor and a memory. However, any processor in a computer device referred to herein may also refer to one or more processors wherein the processor may be in one computing device or in a plurality of computing devices acting in parallel. Additionally, any memory in a computer device referred to herein may also refer to one or more memories wherein the memories may be in one computing device or in a plurality of computing devices acting in parallel.

As used herein, a processor may include any programmable system including systems using micro-controllers, reduced instruction set circuits (RISC), application specific integrated circuits (ASICs), logic circuits, and any other circuit or processor capable of executing the functions described herein. The above examples are not intended to limit in any way the definition and/or meaning of the term "processor."

In one embodiment, a computer program is provided, and the program is embodied on a computer readable medium. In an example embodiment, the system is executed on a single computer system, without requiring a connection to a server computer. In a further embodiment, the system is being run in a Windows® environment (Windows is a registered trademark of Microsoft Corporation, Redmond, Wash.). In yet another embodiment, the system is run on a mainframe environment and a UNIX® server environment (UNIX is a registered trademark of X/Open Company Limited located in Reading, Berkshire, United Kingdom). The application is flexible and designed to run in various different environments without compromising any major functionality. In some embodiments, the system includes multiple components distributed among a plurality of computing devices. One or more components may be in the form of computer-executable instructions embodied in a computer-readable medium.

As used herein, an element or step recited in the singular and preceded with the word "a" or "an" should be understood as not excluding plural elements or steps, unless such exclusion is explicitly recited. Furthermore, references to "example embodiment" or "one embodiment" of the present disclosure are not intended to be interpreted as excluding the existence of additional embodiments that also incorporate the recited features.

As used herein, the terms "software" and "firmware" are interchangeable, and include any computer program stored in memory for execution by a processor, including RAM memory, ROM memory, EPROM memory, EEPROM memory, and non-volatile RAM (NVRAM) memory. The above memory types are examples only and thus, are not limiting as to the types of memory usable for storage of a computer program.

The systems and processes are not limited to the specific embodiments described herein. In addition, components of each system and each process can be practiced independent and separate from other components and processes described herein. Each component and process also can be used in combination with other assembly packages and processes.

With reference now to the figures and, in particular, with reference to FIG. 1, an illustration of an aircraft is depicted in accordance with an illustrative embodiment. In this illustrative example, aircraft 100 includes a first wing 102 and a second wing 104 that are both attached to a fuselage 106. Aircraft 100 further includes a first engine 108 attached to wing 102 and a second engine 110 attached to wing 104. Fuselage 106 includes a tail section 112 that includes a first horizontal stabilizer 114, a second horizontal stabilizer 116, and a vertical stabilizer 118. Alternatively, aircraft 100 includes any number of engines and any configuration of tail section that facilitates operation of aircraft as described herein.

Fuselage 106 also includes a cockpit area 120 that includes at least one cockpit window 122. Furthermore, fuselage 106 includes a plurality of cabin windows 124. In the exemplary implementation, aircraft 100 includes a window heating system 200 that increases the temperature of at least cockpit window 122, and, in some implementations, cabin windows 124. Increasing the temperature of cockpit window 122 prevents the formation of frost and ice on cockpit window 122 and enables the pilots of aircraft 100 to see the exterior environment ahead of aircraft 100.

Figure 2:
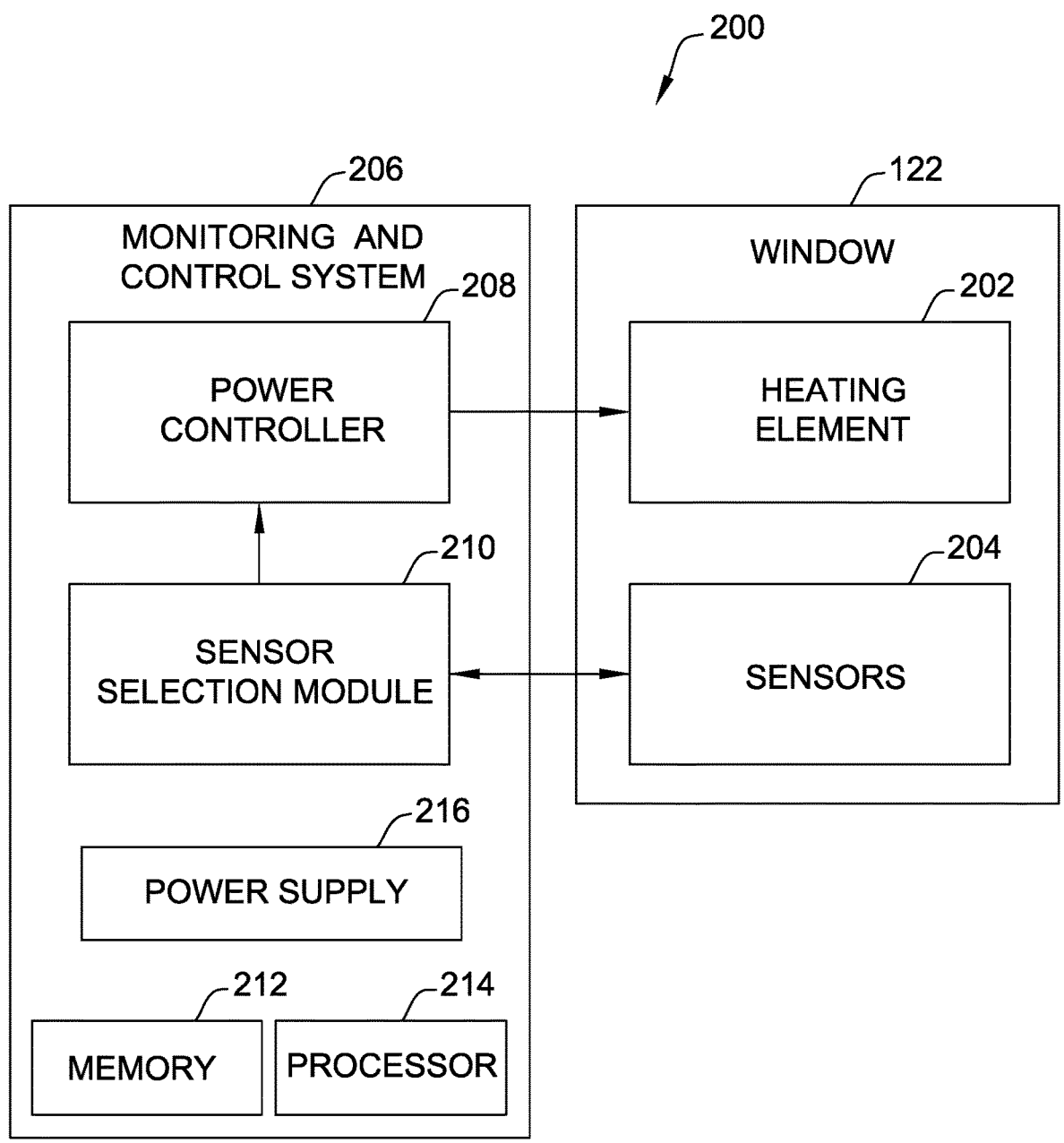
FIG. 2 is a block diagram of a window heating control system that may be used on the aircraft shown in FIG. 1.

FIG. 2 is a block diagram of window heating system 200 that may be used with aircraft 100 (shown in FIG. 1). In the exemplary implementation, window heating system 200 includes a heating element 202 coupled to cockpit window 122 such that an increase in current provided to heating element 202 by window heating system 200 causes the temperature of cockpit window 122 to increase. Window heating system 200 also includes a plurality of sensors 204 coupled to cockpit window 122 such that sensors 204 measure the temperature of cockpit window by measuring the resistance across the sensors 204. As such, the temperature is measured by sensors 204 as a function of the temperature vs. resistance. In the exemplary embodiment, sensors 204 are temperature sensors. Alternatively, sensors 204 may be any type of sensor, such as, but not limited to, a strain gauge, an axial strain gauge, a rosette gauge, an infrared signature sensor, a thermocouple, or other suitable device, that facilitates operation of window heating system 200 as described herein.

In the exemplary embodiment, window heating system 200 also includes a monitoring and control system 206 that includes a power controller 208, a sensor selection module 210, a memory device 212, a processor 214, and a power supply 216 to provide power to the components of monitoring and control system 206 and to heating element 202.

Processor 214 may include one or more processing units (e.g., in a multi-core configuration). Further, processor 214 may be implemented using one or more heterogeneous processor systems in which a main processor is present with secondary processors on a single chip. As another illustrative example, processor 214 may be a symmetric multi-processor system containing multiple processors of the same type. Further, processor 214 may be implemented using any suitable programmable circuit including one or more systems and microcontrollers, microprocessors, reduced instruction set circuits (RISC), application specific integrated circuits (ASIC), programmable logic circuits, field programmable gate arrays (FPGA), and any other circuit capable of executing the functions described herein. Processor 214 determines how much current power controller 208 should provide to heating element 202.

Memory device 212 is one or more devices that enable information such as executable instructions and/or other data to be stored and retrieved. Memory device 212 may include one or more computer readable media, such as, without limitation, dynamic random access memory (DRAM), static random access memory (SRAM), a solid state disk, and/or a hard disk. Memory device 212 may be configured to store, without limitation, application source code, application object code, source code portions of interest, object code portions of interest, configuration data, execution events and/or any other type of data.

In the exemplary embodiment, power controller or controller 208 performs one or more operations described herein by virtue of a programmable processor 214. For example, processor 214 may be programmed by encoding an operation as one or more executable instructions and by providing the executable instructions in memory device 212. Controller 208 may be a computer system in aircraft 100. The computer system may be one or more computers. When more than one computer is present, the computers may communicate with each other with a communications medium such as a network. In another illustrative example, controller 208 may be a hardware device implemented in an integrated circuit. As depicted, controller 208 may be implemented in software, hardware, firmware or a combination thereof. When software is used, the operations performed by controller 208 may be implemented in program code configured to run on processor 214. When firmware is used, the operations performed by controller 208 may be implemented in program code and data and stored in memory device 212 to run on processor 214. When hardware is employed, the hardware may include circuits that operate to perform the operations in controller 208.

In the illustrative examples, the hardware may take the form of a circuit system, an integrated circuit, an application specific integrated circuit (ASIC), a programmable logic device, or some other suitable type of hardware configured to perform a number of operations. With a programmable logic device, the device may be configured to perform the number of operations. The device may be reconfigured at a later time or may be permanently configured to perform the number of operations. Examples of programmable logic devices include, for example, a programmable logic array, a programmable array logic, a field programmable logic array, a field programmable gate array, and other suitable hardware devices. Additionally, the processes may be implemented in organic components integrated with inorganic components and may be comprised entirely of organic components excluding a human being. For example, the processes may be implemented as circuits in organic semiconductors.

In the exemplary implementation, sensor selection module 210 determines a state of the sensors 204 based on a comparison of the current being conducted to each sensor 204 and the current returning from each sensor 204. If the currents match, then sensor selection module 210 sends an "agree" signal to controller 208 indicated that the sensor is in an operable state and no short circuit is present in the sensor 204. Sensor selection module 210 also determines the amount of resistance of each sensor 204 and compares that measured amount to a predetermined range to determine if each sensor 204 is operating within the predetermined resistance range. In one exemplary embodiment, the predetermined range may be a resistance variation 10 percent below the resistance value represented by the lowest temperature typically encountered during flight to 10 percent above the resistance value represented by the highest temperature typically encountered during flight. For example, the lowest temperature encountered may be −65 degrees Fahrenheit and the highest temperature encountered may be 150 degrees Fahrenheit. If sensor selection module 210 determines that a sensor 204 is operating within the predetermined resistance range and the current being conducted to the sensor 204 matches the current returning from the sensor 204, then sensor selection module 210 determines the sensor is operating properly and sends a signal to controller that represents a resistance of cockpit window 122.

Sensors 204 detect an amount of resistance across cockpit window 122. A low resistance reading is indicative of a decrease in temperature in cockpit window 122, and may require controller 208 to provide current to heating element 202 to increase the temperature of cockpit window 122. Alternatively, an increase in measured resistance is indicative of an increase in the temperature of cockpit window 122, and operation of heating element 202 may not be required. Sensors 204 send an output signal representative of the resistance to sensor section module 210, which then provides the output signal to controller 208 upon the determination by sensor selection module 210 that the sensor 204 is operating as desired. Alternatively, when sensor selection module 210 determines that the sensor 204 is operating as desired, controller 208 may receive the output signal directly from sensor 204.

Controller 208 controls the operation of heating element 202 based on the output signal provided by sensors 204. Specifically, controller 208 compares the output signal to a predetermined set point and provides heating element 202 with power if the resistance signal from sensors 204 is lower than the predetermined set point. In one exemplary embodiment, the predetermined set point may be a resistance value that is at least 10 percent lower than the nominal resistance value of the sensor 218 at 70 degrees Fahrenheit, for example. More specifically, controller 208 provides a predetermined amount of current to heating element 202 based on the output signal from sensors 204. Heating element 202 then increases the temperature of cockpit window 122 to within a predetermined range that prevents or reduces fog, frost, and/or ice on cockpit window 122, but not so high as to shorten the service lifetime of cockpit window 122.

Referring still to FIG. 2, if sensor selection module 210 detects that the current supplied to a given sensor 204 is different from, or outside an acceptable range of, the current retuning from the sensor 204, then sensor selection module 210 determines if there is a corresponding current match on a different sensor 204 of the plurality of sensors 204. If so, sensor selection module 210 provides the resistance output signal of that sensor 204 to controller 208 upon the determination by sensor selection module 210 that the sensor 204 is operating as desired. If sensor selection module 210 determines that none of the sensors 204 provide a current match to the out-of-range current of the given sensor 204, then sensor selection module 210 sends a signal to controller 208 and controller 208 switches into a nominal mode to provide heating element 202 with a nominal amount of power that causes heating element 202 to keep cockpit window 122 within a temperature range that prevents or reduces frost and ice buildup. In one exemplary embodiment, the nominal amount of power may be a power level of 1000 watts, for example. Similarly, if sensor selection module 210 determines that the amount of resistance of each sensor 204 is outside a predetermined range, then sensor selection module 210 sends a signal to controller 208 to switch into the nominal mode regardless of whether the sensors 204 provide a current match. As such, window heating system 200 provides heating element 202 with a nominal amount of power to keep cockpit window 122 within a temperature range even when controller 208 is not operating based on the measured resistance of the sensors 204.

Figure 3:
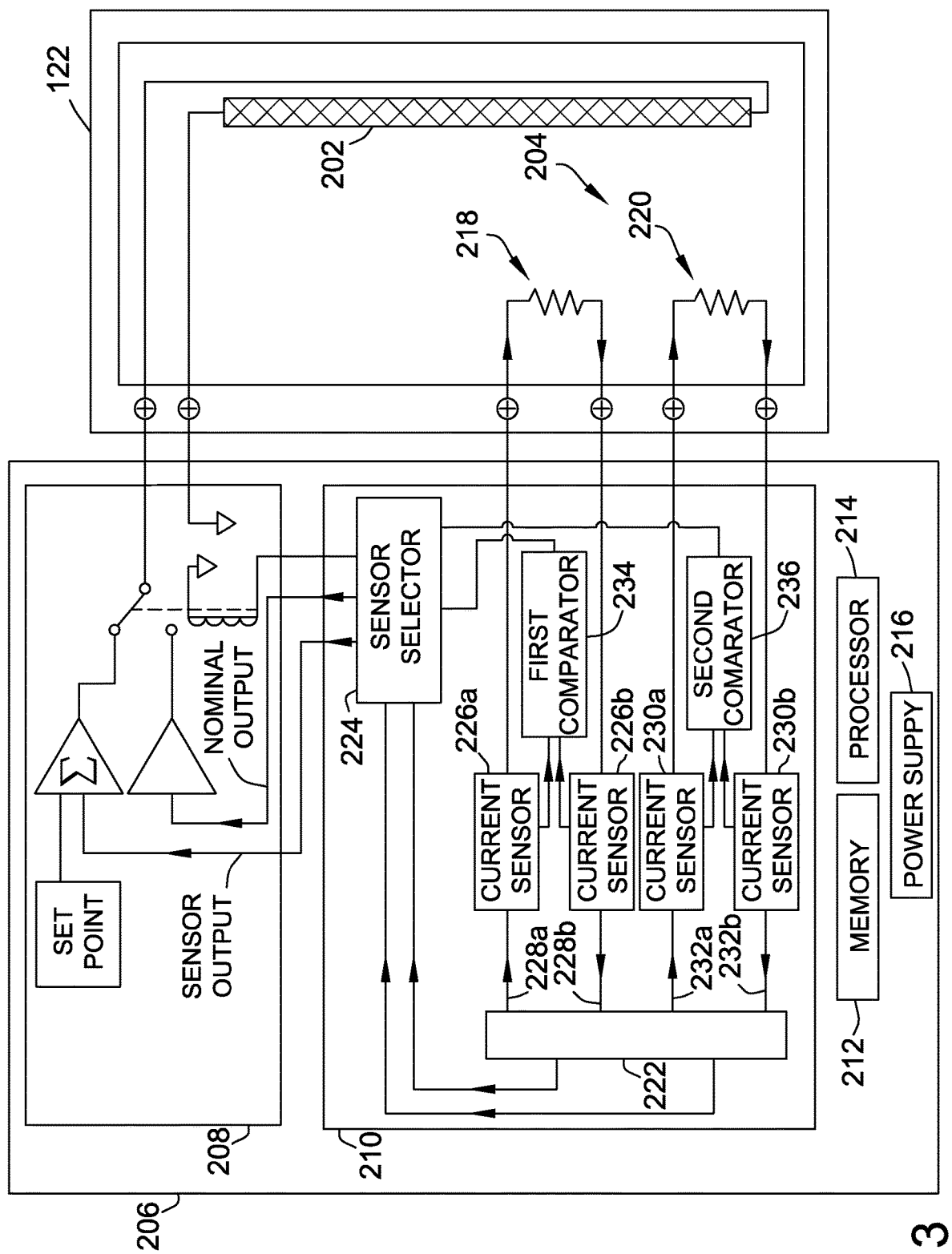
FIG. 3 is a more detailed block diagram of the window heating control system shown in FIG. 2.
Figure 4:
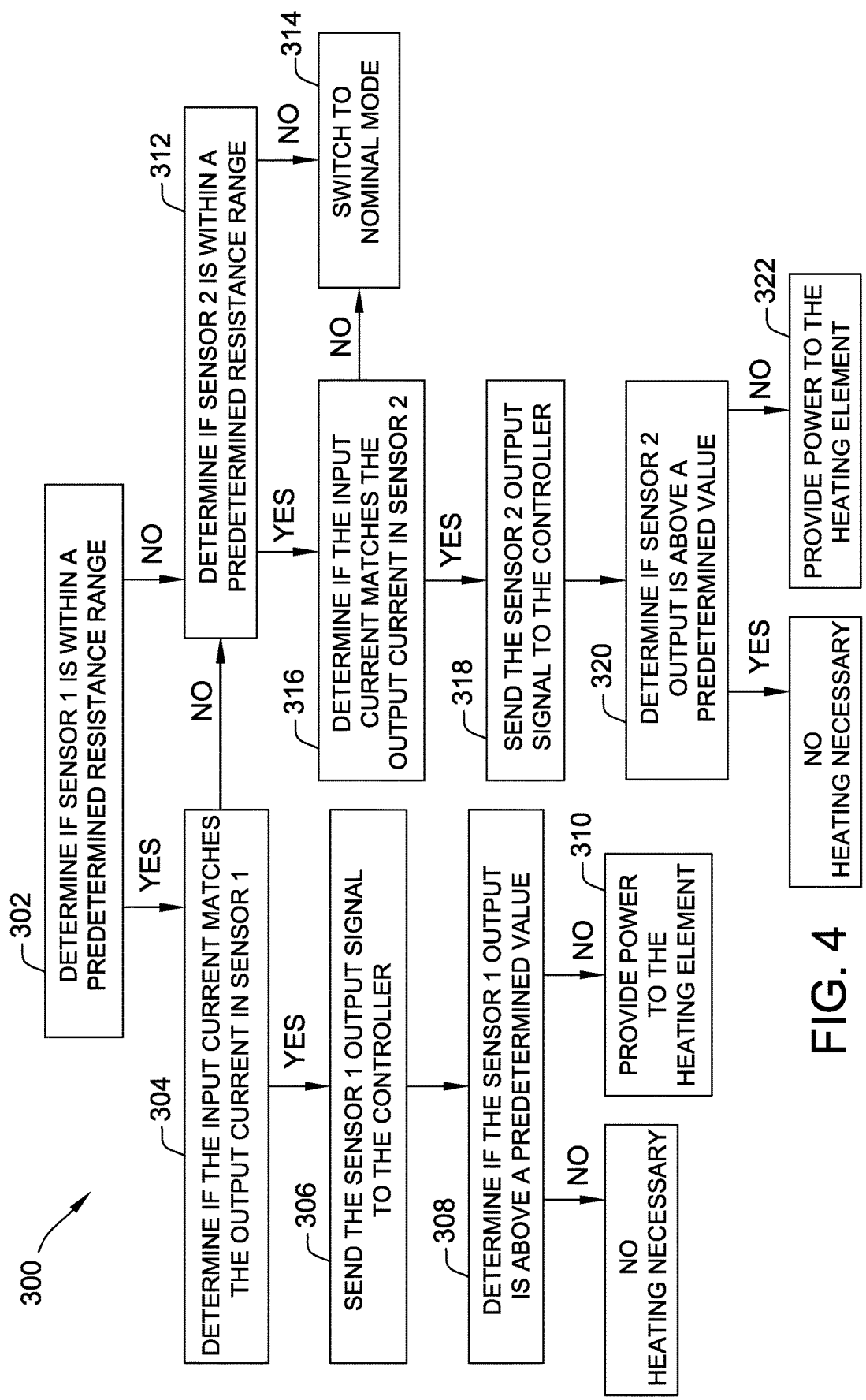
FIG. 4 is a flowchart for a process for controlling the heating of a window using the window heating controlling system shown in FIG. 3.

FIG. 3 is a more detailed block diagram of window heating system 200 and FIG. 4 is a flowchart for a process for controlling the heating of cockpit window 122 using window heating system 200. In the exemplary implementation, sensors 204 include a first temperature sensor 218 disposed proximate cockpit window 122 and a second temperature sensor 220 disposed proximate cockpit window 122. As described herein, cockpit window 122 includes a resistance that varies with changes in the temperature of the window and sensors 218 and 220 separately measure the resistance of cockpit window 122.

As best shown in FIG. 3, sensor selection module 210 includes a power and monitoring unit 222 communicatively coupled to a sensor selector unit 224. Sensor selection module 210 also includes a first pair of current sensors 226a and 226b electrically coupled between first sensor 218 and a first pair of power source connections 228a and 228b on power and monitoring unit 222 such that first pair of current sensors 226a and 226b are coupled in series with first sensor 218. In the exemplary implementation, power and monitoring unit 222 receives power from power supply 216 and provides current to sensors 218 and 220. Similarly, sensor selection module 210 also includes a second pair of current sensors 230a and 230b electrically coupled between second sensor 220 and a second pair of power source connections 232a and 232b on power and monitoring unit 222 such that second pair of current sensors 230a and 230b are coupled in series with second sensor 220. Additionally, sensor selection module 210 includes a first comparator 234 associated with first sensor 218 that compares the values measured by first pair of current sensors 226a and 226b and provides a match output where a difference between first pair of current sensors 226a and 226b is within a predetermined amount (e.g., if the current sensors are within 5 percent of each other). Similarly, a second comparator 236 is associated with second sensor 220 and compares the values measured by second pair of current sensors 232a and 232b and provides a match output where a difference between second pair of current sensors 232a and 232b is within a predetermined amount.

In the exemplary implementation, sensor selection module 210 is configured to determine a state of first sensor 218 and second sensor 220 based on a determination by first comparator 234 and second comparator 236 of whether the condition of first sensor 218 and second sensor 220 is satisfied. More specifically, the conditions to be determined is whether a difference in the sensed current across first sensor 218 by first pair of current sensors 226a and 226b is within a predetermined range, if there is a difference at all, and whether a difference in the sensed current across second sensor 220 by second pair of current sensors 230a and 230b is within a predetermined range, if there is a difference at all. When the difference in the sensed current across first sensor 218 by first pair of current sensors 226a and 226b is within the predetermined range, then first sensor 218 is in an operable state. However, when the difference in the sensed current across first sensor 218 is not within the predetermined range, then first sensor 218 is in an inoperable state, for example, experiencing a short circuit. Similarly, when the difference in the sensed current across second sensor 220 by second pair of current sensors 230a and 230b is within the predetermined range, then second sensor 220 is in an operable state. However, when the difference in the sensed current across second sensor 220 is not within the predetermined range, then second sensor 220 is in an inoperable state, for example, experiencing a short circuit.

In operation, current sensors 226a and 230a measure the current provided to sensors 218 and 220, respectively, by power and monitoring unit 222 and send a signal representative of the measured current to first comparator 234 and second comparator 236, respectively. Current sensors 226b and 230b measure the current returning to power and monitoring unit 222 from first sensor 218 and second sensor 220, respectively, and send a signal representative of the measured current to first comparator 234 and second comparator 236, respectively. First comparator 234 compares the current signals from current sensors 226a and 226b to determine if they match or are within a predetermined range of each other. (e.g., if the current sensors are within 5 percent of each other) Similarly, second comparator 236 compares the current signals from current sensors 230a and 230b to determine if they match or are within a predetermined range of each other. If the current measurements from first current sensors 226a and 226b match or are within the predetermined range, then first comparator 234 sends an "agree" signal to sensor selector unit 224. If the current measurements from first current sensors 226a and 226b do not match or are not within the predetermined range, then first comparator 234 sends a "disagree" signal to sensor selector unit 224. Similarly, if the current measurements from second current sensors 230a and 230b match or are within the predetermined range, then second comparator 236 sends an "agree" signal to sensor selector unit 224. If the current measurements from second current sensors 230a and 230b do not match or are not within the predetermined range, then second comparator 236 sends a "disagree" signal to sensor selector unit 224.

As described herein, nonmatching measurements from first current sensors 226a and 226b or from second current sensors 230a and 230b may be indicative of a partial short circuit in first sensor 218 or second sensor 220. A partial short circuit may occur because of a loose connection, a faulty component, or fluid ingress between window sensor terminals. As described herein, sensor selection module 210 sends the resistance measurement from first sensor 218 or second sensor 220 to controller 208 only when an "agree" signal is sent by comparators 234 or 236.

In the exemplary implementation, power and monitoring unit 222 provides current to sensors 218 and 220 and also measures the resistance across each sensor 218 and 220 to determine if sensors 218 and 220 are operating within a predetermined range or at least above a predetermined minimum resistance. A low resistance measurement may be indicative of a short circuit in one of sensors 218 or 220. For example, power and monitoring unit 222 determines whether either sensors 218 and 220 are operating within a predetermined range or at least above a predetermined minimum resistance and, if so, sends a signal to sensor selector unit 224 representative thereof. Alternatively, if either first sensor 218 or second sensor 220 are operating outside a predetermined range or below a predetermined minimum resistance, then power and monitoring unit 222 sends a signal representative thereof to sensor selector unit 224.

A short circuit occurs when there is little to no resistance to current flowing through first sensor 218 or second sensor 220 and may be caused by moisture in cockpit window 122. Moisture is known to make components more conductive, and, therefore, less resistant to current flow. If not for power and monitoring unit 222 determining whether first sensor 218 and second sensor 220 are within a predetermined resistance range, a short circuit in first sensor 218 or second sensor 220 would cause an erroneous temperature measurement to be sent to controller 208, which would result in controller 208 providing an unnecessary amount of power to heating element 202. However, because power and monitoring unit 222 confirms that first sensor 218 and second sensor 220 are within the predetermined resistance range before sending any signals to controller 208, window heating system 200 prevents controller 208 from supplying heating element 202 with excessive power.

As described herein, sensor selector unit 224 includes logic that may be stored on memory device 212, which determines what type of signals to send to controller 208. In the exemplary implementation, first sensor 218 is the default sensor. When first comparator 234 sends an "agree" signal to sensor selector unit 224 to indicate a current match output of first pair of current sensors 226a and 226b, and power and monitoring unit 222 sends a signal to indicate that first sensor 218 is operating within the predetermined resistance range or above a minimum resistance threshold, then sensor selector unit 224 sends a signal representative of the resistance measurement taken by first sensor 218 to controller 208. Controller 208 then compares the signal from sensor selector unit 224 to a predetermined set point and provides power to heating element 202 if the output from first sensor 218 is below the set point. In one exemplary embodiment, the predetermined set point may be a resistance value that is at least 10 percent lower than the nominal resistance value of the sensor 218 at 70 degrees Fahrenheit, for example. As such, controller 208 controls current flow to heating element 202 based on first sensor 218 when first comparator 234 determines the condition, matching current sensors 226a and 226b, of first sensor 218 is satisfied.

In cases when: 1) first comparator 234 sends a "disagree" signal to sensor selector unit 224 to indicate that first pair of current sensors 226a and 226b do not match; 2) second comparator 236 sends an "agree" signal to sensor selector unit 224 to indicate a current match output of second pair of current sensors 230a and 230b; and 3) power and monitoring unit 222 sends a signal to indicate that second sensor 220 is operating within the predetermined resistance range or above a minimum resistance threshold, then sensor selector unit 224 sends a signal representative of the resistance measurement taken by second sensor 220 to controller 208. Controller 208 then compares the signal from sensor selector unit 224 to a predetermined set point and provides power to heating element 202 if the output from second sensor 220 is below the set point. As such, controller 208 controls current flow to heating element 202 based on second sensor 220 when first comparator 234 determines the condition, matching current sensors 226a and 226b, of first sensor 218 is not satisfied and when second comparator 236 determines the condition, matching current sensors 230a and 230b, of second sensor 220 is satisfied.

Similarly, if power and monitoring unit 222 sends a signal to indicate that first sensor 218 is operating outside the predetermined resistance range or below a minimum resistance threshold, then sensor selector unit 224 sends a signal representative of the resistance measurement taken by second sensor 220 to controller 208 as long as: 1) second comparator 236 sends an "agree" signal to sensor selector unit 224 to indicate a current match output of second pair of current sensors 230a and 230b; and 2) power and monitoring unit 222 sends a signal to indicate that second sensor 220 is operating within the predetermined resistance range or above a minimum resistance threshold. In such cases, controller 208 is configured to control current to heating element 202 based on second sensor 220 when power and monitoring unit 222 determines that first sensor 218 is not within the predetermined resistance range even if first comparator 234 sends an "agree" signal to sensor selector unit 224 to indicate a current match output of first pair of current sensors 226a and 226b.

Furthermore, there are two occasions in which sensor selector unit 224 sends a signal to controller 208 that causes controller 208 to switch to a nominal mode in which controller 208 provides heating element 202 with a nominal amount of power (e.g., a power level of 1000 watts, for example) that causes heating element 202 to keep cockpit window 122 within a predetermined temperature range that prevents or reduces frost and ice buildup. The first occasion that causes controller 208 to switch into nominal mode is when power and monitoring unit 222 sends a signal to indicate that both first sensor 218 and second sensor 220 are operating within the predetermined resistance range or above a minimum resistance threshold, but both first comparator 234 and second comparator 236 sends a "disagree"

signal to sensor selector unit 224 to indicate that neither first pair of current sensors 226a and 226b nor second pair of current sensor 230a and 230b provide a match output. As such, the match output requirement condition is not satisfied for either first sensor 218 or second sensor 220. The second occasions that causes controller 208 to switch into nominal mode is when power and monitoring unit 222 sends a signal to indicate that neither first sensor 218 and second sensor 220 are operating within the predetermined resistance range or above a minimum resistance threshold. In such a case, sensor selector unit 224 sends a signal to controller to switch into the nominal mode regardless of the signals received from first comparator 234 and second comparator 236. As such, window heating system 200 provides heating element 202 with a nominal amount of power to keep cockpit window 122 within a temperature range even when controller 208 is not operating based on the measured resistance of first sensor 218 or second sensor 220.

In the exemplary embodiment, controller 208 is in communication with first comparator 234 and second comparator 236 through sensor selector unit 224, for controlling heating element 202 disposed on aircraft cockpit window 122. More specifically, controller 208 is configured to 1) control the current level to heating element 202 based on first sensor 218 where first comparator 234 provides a match output, or 2) control the current level to heating element 202 based on second sensor 220 where first comparator 234 does not provide a match output and second comparator 236 does provide a match output, or 3) to provide a nominal current to heating element 202 where first comparator 234 and second comparator 236 both do not provide a match output, or 4) to provide a nominal current to heating element 202 where power and monitoring unit 222 determines neither first sensor 218 nor second sensor 220 are operating within the predetermined resistance range or above a minimum resistance threshold.

FIG. 4 is a flowchart 300 for a process for controlling the heating of cockpit window 122 using window heating system 200. The first step is to determine 302 whether first sensor 218 is operating within the predetermined resistance range or above a minimum resistance threshold. As described herein, this step is performed by power and monitoring unit 222. If power and monitoring unit 222 provides a positive signal, then the next step is to determine 304 whether the input current in first sensor 218 matches the output current in first sensor 218. This step is performed by first comparator 234 comparing the current values sensed by first pair of current sensors 226a and 226b. If first comparator 234 provides a "disagree" signal that current sensors 226a and 226b do not match, then power and monitoring unit 222 determines 312 whether first sensor 218 is operating within the predetermined resistance range or above a minimum resistance threshold, as described below. However, if first comparator 234 provides an "agree" signal that current sensors 226a and 226b match, then sensor selector unit 224 sends 306 the output signal, representing a resistance, from first sensor 218 to controller 208.

Next, controller 208 determines 308 if the output signal from first sensor 218 is above a predetermined value. If so, then no heating of cockpit window 122 is necessary and controller 208 does not provide power to heating element 202. However, if the output signal from first sensor 218 is not above a predetermined value, then controller 208 provides 310 an amount of power in the form of current to heating element 202, based on the output resistance signal of first sensor 218, to increase the temperature of cockpit window 122.

Moving back up flowchart 300 to the determining step 302, if power and monitoring unit 222 determines 302 that first sensor 218 is not operating within the predetermined resistance range or above a minimum resistance threshold, then the next step is for power and monitoring unit 222 to determine 312 whether second sensor 220 is operating within the predetermined resistance range or above a minimum resistance threshold. If not, then sensor selector unit 224 sends 314 a signal to controller 208 indicative that neither first sensor 218 nor second sensor 220 are operating within the predetermined resistance range or above a minimum resistance threshold and, as such, controller 208 switches into the nominal mode to provide a nominal amount of power to heating element 202 to keep the temperature of cockpit window 122 within a predetermined range.

Alternatively, if power and monitoring unit 222 determines 312 that second sensor 220 is operating within the predetermined resistance range or above a minimum resistance threshold, then the next step is to determine 316 whether the input current in second sensor 220 matches the output current in second sensor 220. This step is performed by second comparator 236 comparing the current values sensed by second pair of current sensors 230a and 230b. If second comparator 236 provides a "disagree" signal that current sensors 230a and 230b do not match, then sensor selector unit 224 sends 314 a signal to controller 208 indicative that neither first sensor 218 nor second sensor 220 satisfy the current match output condition and, as such, controller 208 switches into the nominal mode.

However, if second comparator 236 provides an "agree" signal that current sensors 230a and 230b match, then sensor selector unit 224 sends 318 the output signal, representing a resistance, from second sensor 220 to controller 208. Next, controller 208 determines 320 if the output signal from second sensor 220 is above a predetermined value. If so, then no heating of cockpit window 122 is necessary and controller 208 does not provide power to heating element 202. However, if the output signal from second sensor 220 is not above a predetermined value, then controller 208 provides 322 power in the form of current to heating element 202 to increase the temperature of cockpit window 122.

Figure 5:
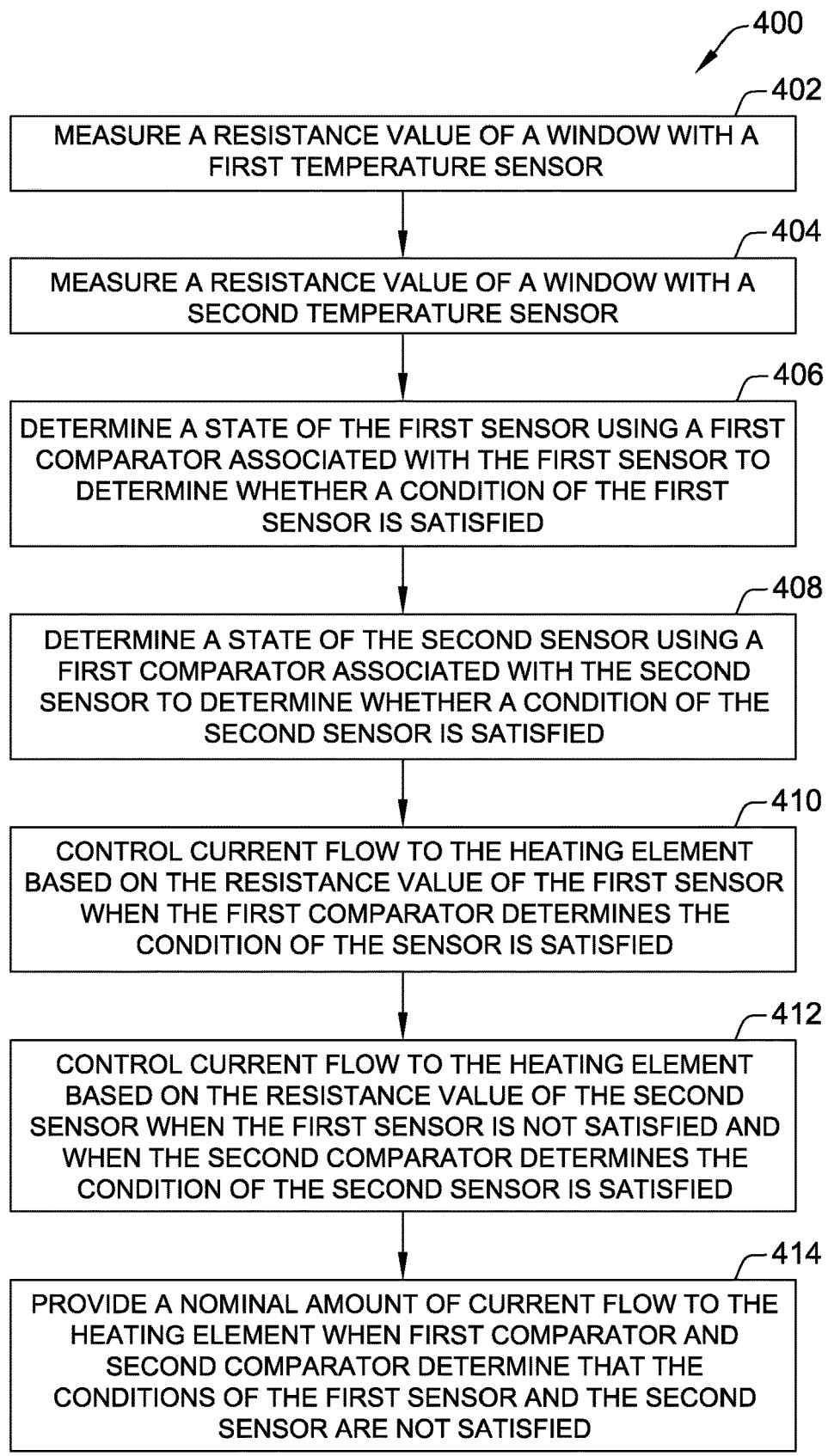
FIG. 5 illustrates a method for controlling the heating of a window using the window heating controlling system shown in FIG. 3.

FIG. 5 illustrates a method 400 for controlling the heating of cockpit window 122 using window heating system 200 shown in FIG. 3. Method 400 includes measuring 402 a resistance value of cockpit window 122 with first sensor 218 and measuring 404 a resistance value of cockpit window 122 with second sensor 220. As described herein, the resistance of cockpit window 122 changes with temperature, so the temperature of cockpit window 122 can be determined by the resistance values measured by sensors 218 and 220.

Method 400 also includes determining 406 a state of first sensor 218 using first comparator 234 associated with first sensor 218 to determine whether a condition of first sensor 218 is satisfied. Similarly, a state of second sensor 220 is determined 408 using second comparator 236 associated with second sensor 220 to determine whether a condition of second sensor 220 is satisfied. As described herein, determining 406 a state of first sensor 218 using first comparator 234 includes comparing sensed current values of first pair of current sensors 226a and 226b. If the difference in sensed current across first sensor 218 between first pair of current sensors 226a and 226b is within a predetermined range, then the condition of first sensor 218 is satisfied and the state of first sensor 218 is operational.

Similarly, determining 408 a state of second sensor 220 using second comparator 236 includes comparing sensed current values of second pair of current sensors 230*a* and 230*b*. If the difference in sensed current across second sensor 220 between first pair of current sensors 230*a* and 230*b* is within a predetermined range, then the condition of second sensor 220 is satisfied and the state of second sensor 220 is operational.

Method 400 also includes controlling 410 current flow to heating element 202 based on the resistance value of first sensor 218 when first comparator 234 determines the condition of first sensor 218 is satisfied, that is, when first comparator 234 determines the difference in sensed current across first sensor 218 between first pair of current sensors 226*a* and 226*b* is within a predetermined range.

Method 400 also includes controlling 412 current flow to heating element 202 based on the resistance value of second sensor 220 when first comparator 234 determines the condition of first sensor 218 is not satisfied (when first comparator 234 determines the difference in sensed current across first sensor 218 between first pair of current sensors 226*a* and 226*b* is not within a predetermined range) and when second comparator 236 determines the condition of second sensor 220 is satisfied (when second comparator 236 determines the difference in sensed current across second sensor 220 between second pair of current sensors 230*a* and 230*b* is within a predetermined range).

Additionally, a nominal amount of current flow is provided 414 to heating element 202 when first comparator 234 and second comparator 236 both determine that the conditions of first sensor 218 and second sensor 220 are not satisfied. That is, controller 208 provides 414 the nominal current when first comparator 234 determines the difference in sensed current across first sensor 218 between first pair of current sensors 226*a* and 226*b* is not within a predetermined range and when second comparator 236 determines the difference in sensed current across second sensor 220 between second pair of current sensors 230*a* and 230*b* is not within a predetermined range.

The window heating system described herein is able to detect a partial short circuit condition in a primary sensor and automatically switch to base operation on a signal from a secondary, backup sensor after detection of the partial short circuit in the primary sensor. Such automatic recovery prevents a time consuming system restart that may result in power not being provide to a heating element for an extended duration. Additionally, the window heating system described herein is able to detect when both the primary sensor and the secondary sensor are experiencing a partial short circuit condition and, rather than disable the system as in at least some known heating systems, automatically switch to a nominal operational mode to provide the heating element with an amount of power to maintain the window at a temperature that prevents ice formation. In such a nominal operating mode, the amount of power provided to the heating element is not based on signals from either of the sensors, and, as such, facilitates preventing ice formation on the cockpit window even when neither sensor is operational.

Although specific features of various embodiments of the invention may be shown in some drawings and not in others, this is for convenience only. In accordance with the principles of the invention, any feature of a drawing may be referenced and/or claimed in combination with any feature of any other drawing.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A window heating system for providing current to a heating element, said window heating system comprising:
    a first sensor;
    a second sensor;
    a sensor selection module configured to determine a state of at least said first sensor, said sensor selection module comprising:
        a first comparator associated with said first sensor and configured to determine whether a condition of said first sensor is satisfied; and
        a first pair of current sensors electrically coupled between said first sensor and a power supply, and wherein the condition comprises a difference in sensed current across said first sensor between said first pair of current sensors is within a predetermined range
    a controller configured to control current to the heating element based on said second sensor when said first comparator determines the condition of said first sensor is not satisfied.

2. The window heating system of claim 1, wherein said sensor selection module comprises a second comparator associated with said second sensor and configured to determine whether a condition of said second sensor is satisfied.

3. The window heating system of claim 2, wherein said controller is configured to provide a nominal current to the heating element when said first comparator and said second comparator determine the conditions of said first sensor and said second sensor are not satisfied.

4. The window heating system of claim 2,
    wherein said sensor selection module comprises a second pair of current sensors electrically coupled between said second sensor and a power supply, and wherein the condition of said second sensor comprises a difference in sensed current across said second sensor between said second pair of current sensors is within a predetermined range.

5. The window heating system of claim 1, wherein said controller is configured to control current to the heating element based on said first sensor when said first comparator determines the condition of said first sensor is satisfied.

6. The window heating system of claim 1, wherein said sensor selection module comprises a power and monitoring unit configured to determine if said first sensor is operating within a predetermined resistance range.

7. The window heating system of claim 6, wherein said controller is configured to control current to the heating element based on said second sensor when said power and monitoring unit determined said first sensor is not within the predetermined resistance range.

8. The window heating system of claim 6, wherein said power and monitoring unit is configured to determine if said second sensor is operating within a predetermined resistance range, and wherein said controller is configured to provide a nominal current to the heating element when said first sensor and said second sensor are not within the predetermined resistance range.

9. An aircraft window heating system, comprising:
a first sensor disposed proximate an aircraft window, having a resistance that varies with changes in a temperature of the aircraft window;
a first pair of current sensors respectively disposed between a first pair of power source connections and the first sensor, such that the first pair of current sensors are in series with the first sensor;
a first comparator that provides a match output where a difference between the first pair of current sensors is within a predetermined amount;
a second sensor disposed proximate the aircraft window, having a resistance that varies with changes in the temperature of the aircraft window;
a second pair of current sensors respectively disposed between a second pair of power source connections and the second sensor, such that the second pair of current sensors are in series with the second sensor;
a second comparator that provides a match output where the difference between the second pair of current sensors is within a predetermined amount; and
a controller in communication with the first comparator and second comparator, for controlling a heating element disposed on the aircraft window,
wherein the controller is configured to control a current level to the heating element based on the first sensor where the first comparator provides a match output, and to control the current level to the heating element based on the second sensor where the first comparator does not provide a match output and the second comparator provides a match output, and to provide a nominal current to the heating element where the first comparator and second comparator both do not provide a match output.

10. The aircraft window heating system of claim 9, further comprising a power and monitoring unit configured to determine if said first sensor is operating within a predetermined resistance range, wherein said controller is configured to control current to the heating element based on said second sensor when said power and monitoring unit determined said first sensor is not within the predetermined resistance range.

11. The aircraft window heating system of claim 10, wherein said power and monitoring unit is configured to determine if said second sensor is operating within a predetermined resistance range, wherein said controller is configured to provide a nominal current to the heating element when said first sensor and said second sensor are not within the predetermined resistance range.

12. A method of controlling current to a heating element to provide heat to a window in a window heating system, said method comprising:
measuring a resistance value of the window with a first sensor;
measuring a resistance value of the window with a second sensor;
determining a state of the first sensor using a first comparator associated with the first sensor to determine whether a condition of the first sensor is satisfied by comparing sensed current values of a first pair of current sensors coupled in series on opposite sides of the first sensor;
determining a state of the second sensor using a second comparator associated with the second sensor to determine whether a condition of the second sensor is satisfied by comparing sensed current values of a second pair of current sensors coupled in series on opposite sides of the second sensor;
controlling current flow to the heating element based on the resistance value of the first sensor when the first comparator determines the condition of the first sensor is satisfied;
controlling current flow to the heating element based on the resistance value of the second sensor when the first comparator determines the condition of the first sensor is not satisfied and when the second comparator determines the condition of the second sensor is satisfied; and
providing a nominal amount of current flow to the heating element when the first comparator and the second comparator determine that the conditions of the first sensor and the second sensor are not satisfied.

13. The method according to claim 12, wherein providing the nominal amount of current flow comprises providing the nominal amount of current flow to the heating element when the first comparator and the second comparator determine that the conditions of the first sensor and the second sensor are not satisfied based on the sensed current values of the first pair of current sensors and the sensed current values of the second pair of current sensors.

14. The method according to claim 12, wherein the condition of the first sensor is satisfied when a difference in sensed current across the first sensor between the first pair of current sensors is within a predetermined range, and wherein the condition of the second sensor is satisfied when a difference in sensed current across the second sensor between the second pair of current sensors is within a predetermined range.

15. The method according to claim 12, further comprising:
determining if the first sensor is operating within a predetermined resistance range; and
determining if the second sensor is operating within a predetermined resistance range.

16. The method according to claim 15, wherein controlling current flow to the heating element based on the resistance value of the first sensor comprises controlling current flow to the heating element based on the resistance value of the first sensor when the first comparator determines the condition of the first sensor is satisfied and when the first sensor is operating within the predetermined resistance range.

17. The method according to claim 15, wherein controlling current flow to the heating element based on the resistance value of the second sensor comprises controlling current flow to the heating element based on the resistance value of the second sensor when
a) the first comparator determines the condition of the first sensor is not satisfied, or
b) the first sensor is not operating within the predetermined resistance range, and
c) the second comparator determines the condition of the second sensor is satisfied, and
d) the second sensor is operating within the predetermined resistance range.

18. The method according to claim 15, further comprising providing a nominal amount of current flow to the heating element when neither the first sensor nor the second sensor are operating within the predetermined resistance range.

19. The aircraft window heating system of claim 9, wherein the controller is configured to compare a resistance value of said first sensor to a predetermined set point and control current to the heating element if the resistance value of said first sensor is lower than the predetermined set point, wherein the predetermined set point is at least 10 percent lower than a nominal resistance value of said first sensor at 70 degrees Fahrenheit.

20. The aircraft window heating system of claim 9, wherein said controller provides a predetermined amount of current to the heating element based on the resistance of said first sensor or said second sensor to increase the temperature of the window within a predetermined range that reduces fog, frost and/or ice on the window.

21. The aircraft window heating system of claim 9, wherein said first comparator provides a match output when said first pair of current sensors provide current values within 5 percent of each other.

22. The window heating system of claim 1, wherein the controller is configured to compare a resistance value of said first sensor to a predetermined set point and control current to the heating element if the resistance value of said first sensor is lower than the predetermined set point, wherein the predetermined set point is at least 10 percent lower than a nominal resistance value of said first sensor at 70 degrees Fahrenheit.

23. The window heating system of claim 1, wherein said first comparator provides a match output when said first pair of current sensors provide current values within 5 percent of each other.

* * * * *